United States Patent [19]

Gombert et al.

[11] Patent Number: 4,481,647

[45] Date of Patent: Nov. 6, 1984

[54] METHOD AND APPARATUS OF COMPENSATING FOR VARIATIONS IN SIGNAL PROPAGATION TIME EXISTING WITHIN THE CHANNELS OF A MULTI-CHANNEL DEVICE

[75] Inventors: Glenn J. Gombert, Hillsboro; Steven R. Palmquist, Beaverton, both of Oreg.

[73] Assignee: Tektronix, Inc., Beaverton, Oreg.

[21] Appl. No.: 375,506

[22] Filed: May 6, 1982

[30] Foreign Application Priority Data

May 15, 1981 [JP] Japan ................... 56-73326

[51] Int. Cl.$^3$ ............................ H04L 7/04
[52] U.S. Cl. .................... 375/107; 370/100
[58] Field of Search ............. 375/36, 38, 106, 107, 375/118; 455/27, 49, 51; 360/26; 328/55, 58, 72; 370/100, 108

[56] References Cited

U.S. PATENT DOCUMENTS

| | | | |
|---|---|---|---|
| 3,118,111 | 1/1964 | Miller | 375/107 |
| 3,204,228 | 8/1965 | Eckert, Jr. | 360/26 |
| 3,327,299 | 6/1967 | Johnson | 360/26 |
| 3,660,647 | 5/1972 | Pryor, Jr. | 328/55 |
| 3,961,270 | 6/1976 | Ullmann et al. | 375/107 |
| 4,218,654 | 8/1980 | Ogawa et al. | 375/107 |

Primary Examiner—Robert L. Griffin
Assistant Examiner—Stephen Chin
Attorney, Agent, or Firm—John H. Bouchard

[57] ABSTRACT

An input apparatus for a logic analyzer is disclosed which receives a plurality of logic signals from a probe, the plurality of logic signals being received at different points in time, the input apparatus being capable of generating a corresponding plurality of logic signals in response thereto, the time of generation of the corresponding plurality of logic signals substantially coinciding with the time of generation of a corresponding reference logic signal. The input apparatus comprises a plurality of tapped delay lines corresponding to the plurality of received logic signals. A controller controls the amount of time delay for each delay line associated with each received logic signal. The controller continues this control function until the time of generation of the corresponding plurality of logic signals substantially coincides with the time of generation of the corresponding reference logic signal. The controller provides the control function by comparing the time of receipt of one of the plurality of logic signals with the time of receipt of a reference logic signal and controlling the amount of time delay of the associated delay line until the time of generation of the corresponding logic signal substantially coincides with the time of generation of the corresponding reference logic signal.

4 Claims, 3 Drawing Figures

METHOD AND APPARATUS OF COMPENSATING FOR VARIATIONS IN SIGNAL PROPAGATION TIME EXISTING WITHIN THE CHANNELS OF A MULTI-CHANNEL DEVICE

BACKGROUND OF THE INVENTION

1. Field of the Invention

The present invention relates generally to an input apparatus for a multi-channel device, such as a logic analyzer, more particularly, to a time delay compensation circuit disposed within said input apparatus for compensating for variations in signal propagation time which inherently exists within the channels of said multi-channel device.

2. Description of the Prior Art

Most advanced electronic equipment in use today include complex integrated circuit logic systems, such as those used in microprocessors. Complicated multi-channel devices, such as a logic analyzer, are used for troubleshooting these logic systems. Most existing logic analyzers include a multi-channel probe input attached thereto, for example, a 16-channel probe, for acquiring logic signals, and a storage area (e.g., an acquisition memory) for storing the logic signals therein. The logic signals stored in the storage area are retrieved therefrom for display on the logic analyzer display. However, a large number of cables are used for connecting each probe to the logic analyzer. Usually, the length of any one cable is different than the length of any of the other adjacent cables. Since the logic signals must be transmitted through these cables, if a particular cable is longer than another adjacent cable, a longer period of time is required for the logic signal to be transmitted through the former cable than it is for the logic signal to be transmitted through the adjacent cable. Any difference in cable length, among these cables, results in skewed logic data signals displayed on the cathode ray tube (CRT) screen of the logic analyzer. These skewed data signals introduce a measurement error. Skewed logic data signals are also produced as a result of differences in propagation time delay through the input circuitry of the logic analyzer. This measurement error is not acceptable, especially when it occurs in conjunction with high-frequency, or high-acquisition rate test instruments.

SUMMARY OF THE INVENTION

It is a primary object of the present invention to provide an input apparatus for a multi-channel device for compensating for variations in signal propagation time existing with the channels of said multi-channel device.

It is another primary object of the present invention to provide an input apparatus for a multi-channel device including a compensating means for compensating for differences in transmission line cable length and for differences in propagation time of the logic signals transmitted therethrough, thereby deskewing the logic signals displayed on the CRT screen of the logic analyzer.

It is another object of the present invention to provide an input apparatus for a multi-channel logic analyzer including a time delay compensation circuit for either increasing or decreasing the time delay associated with each channel of the logic analyzer until the logic signals transmitted therethrough have been deskewed, the deskewed logic data signals being displayed on the CRT screen of the logic analyzer.

These and other objects of the present invention are accomplished by including a circuit within the body of the logic analyzer which transmits clock signals through each of the cables of the probe. One cable will have associated therewith a fixed time delay means. The fixed time delay means establishes a reference standard. The other cables will have associated therewith a variable time delay means. If a clock signal, associated with a cable having the variable time delay, arrives at a designated arrival point at a time prior to the arrival of a clock signal associated with the cable having the fixed time delay, the circuit embodied in the logic analyzer will increase the time delay associated with the cable having the variable time delay means. When the clock signal is again retransmitted through the above mentioned two cables, the arrival times of the abovementioned clock signals at the designated arrival point are again compared with one another. When the arrival time of former clock signal at the designated arrival point substantially coincides with the arrival time of the latter clock signal, the time delay setting on said variable time delay means is fixed in order to ensure that all future clock signals of the former type will arrive at its designated arrival point at approximately the same time as will the clock signals of the latter type. Therefore, the logic signals, stored in the storage area and displayed on the CRT will be deskewed with respect to each other. This eliminates any possibility of measurement error.

Further scope of applicability of the present invention will become apparent from the description given hereinafter. However, it should be understood that the details of the description and the specific examples, while indicating preferred embodiments of the invention, are given by way of illustration only, since various changes and modifications within the spirit and scope of the invention will become apparent to those skilled in the art from this detailed description.

BRIEF DESCRIPTION OF THE DRAWINGS

A full understanding of the present invention will be obtained from the detailed description given hereinbelow and the accompanying drawings which are given by way of illustration only, and thus are not limitative of the present invention, and wherein.

DESCRIPTION OF THE PREFERRED EMBODIMENT

Figures 1, 2:
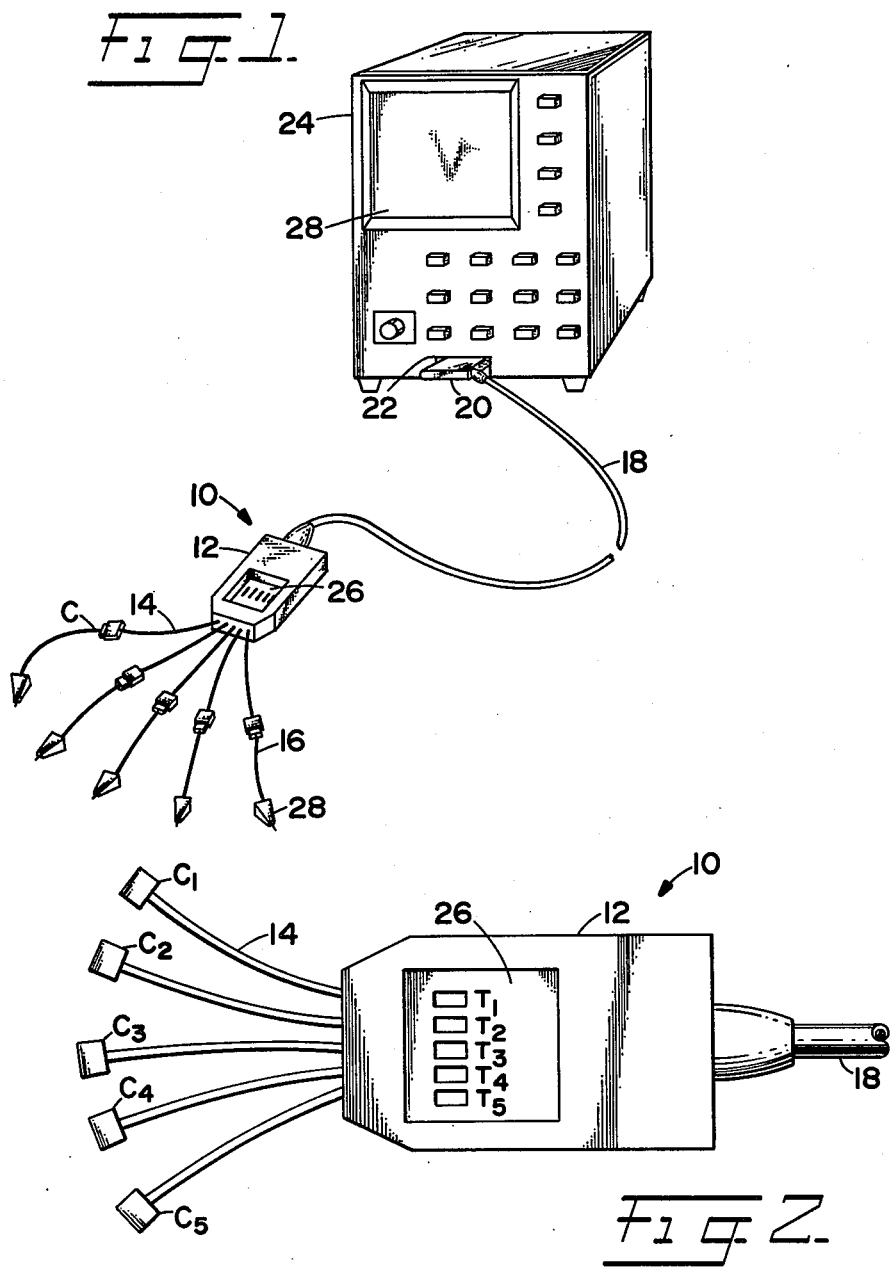
FIG. 1 is a perspective view of a logic analyzer instrument and a probe attached thereto incorporating the input apparatus of the present invention.
FIG. 2 is an enlarged plan view of the probe of FIG. 1 including a probe pod and a plurality of probe tips attached thereto.

One preferred embodiment of the present invention will be described in detail hereinafter by reference to the accompanying drawings. FIG. 1 illustrates a simplified perspective view of a logic analyzer 24 and a probe 10 attached thereto, including the input apparatus of the present invention. Acquisition probe 10 includes probe pod 12 having connected on one end thereof insulated short wires 14, connectors C, connected to the ends of the insulated short wires 14, probe tips 16 connected to the individual connectors C, respectively, and a clip 28 connected, respectively, to each probe tip 16. Any conventional type of clip 28 may be used for acquiring logic data signals from a product under test. Probe pod 12 has connected on the other end thereof a cable 18. A data connector 20 is connected to the logic analyzer 24 of the present invention via the cable 18. The data connector 20 resides in a data input port 22. The probe pod 12 further includes terminal portions 26. The function of these terminal portions 26 will be described hereinafter.

In the embodiment shown in FIG. 1, the probe pod 12 has five short wires 14 input thereto, four of the wires representing data channels for transmission of the logic data signals therethrough, one wire representing a clock channel for transmission of a reference clock signal therethrough. Although five wires 14 have been illustrated as being connected to the probe pod 12, normally, many more insulated short wires 14 are connected thereto for connection to the terminals of a product under test.

Probe pod 12 further includes therein five ECL buffer amplifiers each coupled to receive an input signal from one of the five wires 14. The output of each of the buffer amplifiers is coupled through transmission lines within cable 18 and through data connector 20 to the data input port 22 of the logic analyzer 24. The data input port 22 has a plurality of terminals therein for connection to the terminals within the data connector 20. In the example shown in FIGS. 1-3, the data input port 22 has four terminals (C1-C4) associated with the four data channels, and an additional terminal (C5) associated with the clock channel.

Figure 3:
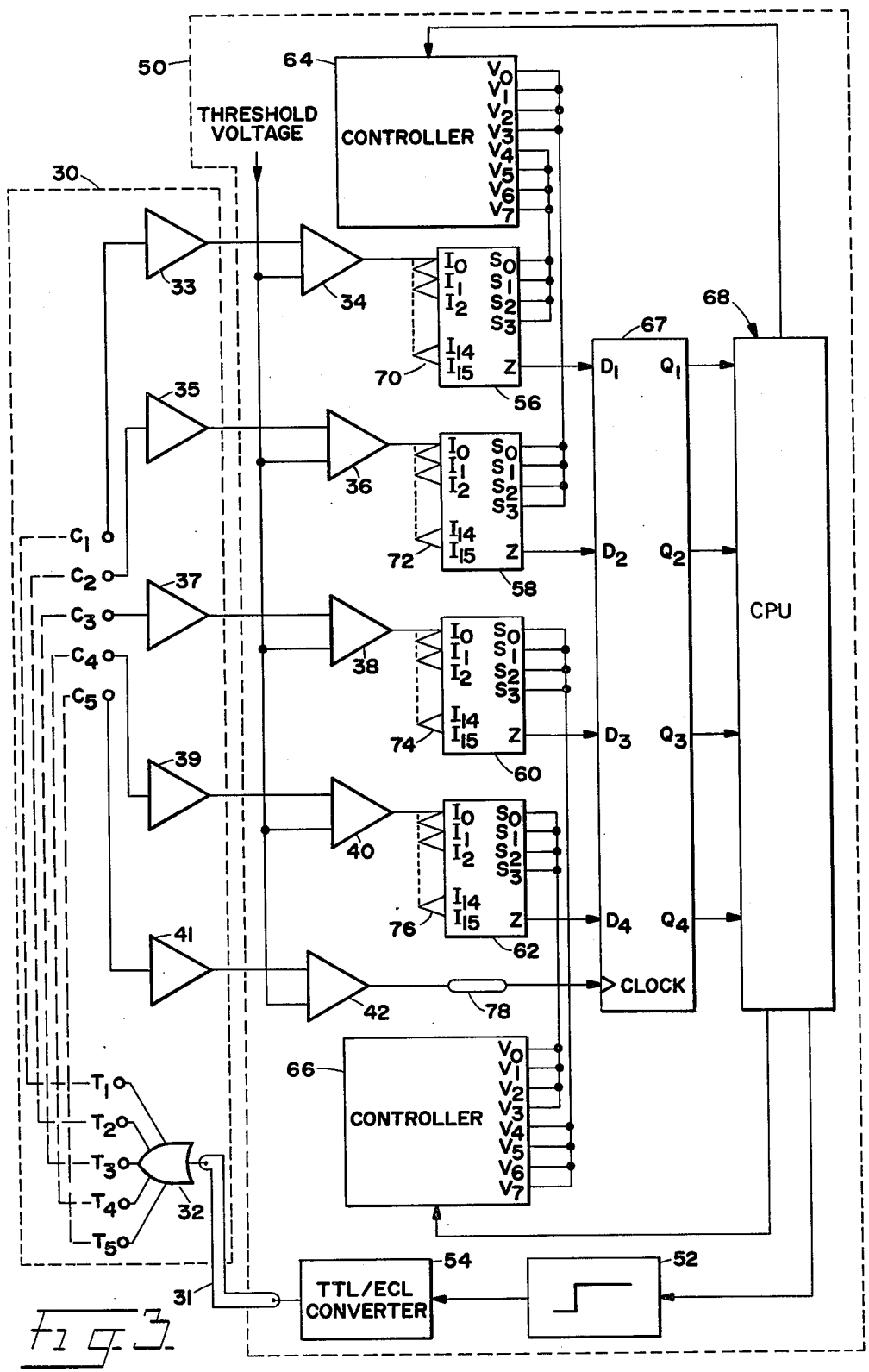
FIG. 3 is a circuit block diagram of the input apparatus of the present invention, part of the circuit being included within the probe pod of FIG. 2, the other part being included within the logic analyzer instrument of FIG. 1.

The logic analyzer 24 includes a plurality of comparators connected, respectively, to the plurality of terminals present in the data input port 22. Each of the comparators receives one of the logic data signals transmitted to the logic analyzer 24 via the wires 14, and cable 18. As can be seen in FIG. 3, each logic data signal is compared with a reference signal in its respective comparator. The reference signal may be a predetermined constant signal, or it maybe a continuously variable signal, depending on the particular application.

The input wires 14 and the transmission lines within the cable 18 may have different lengths, depending on the particular channel. The different lengths cause the different propagation times of the logic signals transmitted therethrough. As a result, if the different propagation times are not corrected for digital waveforms skewed from their true time relational occurrence appear on the CRT screen 28 of the logic analyzer 24. The skewed digital waveforms introduce the measurement error, one of the problems being overcome by virtue of the present invention.

Referring to FIGS. 2 and 3, an enlarged plan view of the probe pod 12 is illustrated, including the input wires 14, the connectors C, and one end of the cable 18. Probe pod 12 includes connector terminal portion 26, the connector terminal portion 26 further including terminals T1 through T5. A common clock signal is generated in the logic analyzer body 24 and is transmitted through the data connector 20 via said additional terminal, through a clock transmission line 31 in cable 18, the common clock signal being applied to each of the terminals T1 through T5 in the probe pod 12. Since the same common clock signal is applied to each of the terminals T1 through T5, each of these clock signals, applied to terminals T1 through T5, would agree in timing if displayed on the CRT screen 28. To initiate a calibration mode wherein the propagation delays of each of the five data transmission channels are to be equalized, connectors C1 through C5 are respectively connected to terminals T1 through T5 via wires 14. When the logic analyzer body 24 sends the clock signals to each of the terminals T1 through T5 via the clock transmission line 31 in cable 18, terminals T1 through T5 apply these clock signals (equal in timing) to the respective connectors C1 through C5. These clock signals are then retransmitted to the logic analyzer body 24 via the input wires 14, the probe pod 12, the transmission lines in cable 18 (five transmission lines in the example of FIG. 2), and the data connector 20 connected to the logic analyzer body 24. Since each of the transmission lines in cable 18 may have a different length with respect to the other transmission lines, the clock signals transmitted through each of the transmission lines in cable 18, corresponding to each of the wires 14, may arrive at the logic analyzer body 24 at different points in time. Another circuit internal to the logic analyzer body 24 will compare the arrival time of the clock signals input thereto from each of the data channel transmission lines in cable 18 having input connectors C1-C4, with the arrival time of the reference clock signal on the fifth transmission line, the clock channel, having input connector C5. A variable time delay circuit within said another circuit, corresponding to each of the data channels in cable 18, will change its time delay in response to the comparison made between the arrival time of the clock signal in each of the data channels and the reference clock signal in the clock channel.

The circuits internal to the probe pod 12 and internal to the logic analyzer body 24 will now be described and illustrated with reference to FIG. 3 of the drawings. Referring to FIG. 3, block 30 represents the circuitry associated with probe 10, including the circuitry associated with probe pod 12 and each of the connectors C1 through C5. Block 50 shown in FIG. 3 represents the circuitry internal to the logic analyzer body 24. As mentioned hereinabove with reference to FIG. 2, probe 10 included probe pod 12 inclusive of terminals T1 through T5, and connectors C1 through C5 attached thereto via wires 14 in the calibration mode. Connectors C1 through C5 and terminals T1 through T5 correspond, respectively, to five channels, channels 1 through 4 being data channels, having variable time delay circuits and channel 5 being clock channel, having a fixed time delay circuit. In FIG. 3, buffer amplifiers 33, 35, 37, 39, and 41 are connected, respectively, to connectors C1 through C5. A gate 32 is connected, at its output end, to each of the five terminals T1 through T5. As mentioned hereinabove, terminals T1 through T5 are respectively connected to connectors C1 through C5 in the calibration mode. In the normal measurement mode of the logic analyzer terminals T1-T5 are unused and connectors C1-C5 are interconnected with the points of interest in the circuit under test.

Block 50, the circuitry internal to the logic analyzer 24, includes comparators 34, 36, 38, 40, and 42 corresponding, respectively, to the buffer amplifiers 33, 35, 37, 39, and 41 internal to the probe 10. Block 50 also includes a Transistor-to-Transistor Logic (TTL)/Emitter Coupled Logic (ECL) converter 54 connected to the input of gate 32, the latter being internal to the probe 10, and lying within block 30. A clock generator 52 is connected at its output to the input of the TTL/ECL converter 54.

The TTL/ECL converter is simply a resistor network implemented, for example, with an 820 ohm resistor connected to ground, a 265 ohm resistor connected to the other end of the 820 ohm resistor, and another 265 ohm resistor connected to the other end of the first mentioned 265 ohm resistor. The TTL input resides at the junction between the first mentioned 265 ohm resistor and the 820 ohm resistor. The ECL output resides at the junction between said another 265 ohm resistor and the first mentioned 265 ohm resistor.

Tapped delay lines 70–76 are connected to the output of comparators 34, 36, 38 and 40, respectively. A fixed delay line 78 is connected to the output of comparator 42. Multiplexers 56 through 62 are connected to each of the tapped delay lines 70 through 76. Controller 64 is connected to multiplexers 56 and 58. Controller 66 is connected to multiplexers 60 and 62. Terminals V0–V3 and V4–V7 of controller 64 are connected to terminals S0–S3 of multiplexers 58 and 56, respectively. Terminals V0–V3 and V4–V7 of controller 66 are connected to terminals S0–S3 of multiplexers 62 and 60, respectively. The controllers 64 and 66 may be identified by industry standard part number 100164. An input latch circuit 67 is connected to each of the multiplexers 56 through 62 and to the fixed delay line 78. Lead wires connect the input of latch circuit 67 to the outputs of each of the multiplexers 56 through 62 and to the fixed delay line 78. The latch circuit 67 can be identified by industry standard part number 100131 and is a quadruple-D input flip-flop. A central processing unit (CPU) 68 is connected to the output of the latch circuit 67. Lead wires connect the latch circuit 67 to the CPU 68, the number of the lead wires corresponding to the number of input lead wires which connect the multiplexers 56 through 62 to the latch circuit 67. The central processing unit (CPU) 68 includes therein the acquisition memory mentioned hereinabove connected to a system bus, a microprocessor (Intel 8086), a ROM, and a RAM, all of which are independently connected to the system bus. An output lead connects the CPU 68 to an input terminal of the clock generator 52. Another output lead from the CPU 68 is connected to an input of the controller 66. A further output lead connects the CPU 68 to the controller 64.

In operation, the CPU 68 instructs the clock generator 52 to develop a TTL level clock signal therefrom. This TTL clock signal is applied to the TTL/ECL converter 54. The converter converts the TTL clock signal to an ECL clock signal. The converted clock signal having the ECL level is applied, via a coaxial cable 31 to the input end of the gate 32. The gate 32 is connected, at its output, to each of the terminals T1 through T5 in the probe pod 12 and applies the converted clock signal to each of the terminals T1 through T5. The terminals T1 through T5 are respectively connected to the connectors C1 through C5 via the wires 14. Each of the clock signals transmitted from the logic analyzer 24, through terminals T1 through T5, and to the connectors C1 through C5, are applied to buffer amplifiers 33, 35, 37, 39, and 41. The output of these buffer amplifiers reflect an amplified version of these converted clock signals. The amplified converted clock signals, generated from the buffer amplifiers, are applied to one terminal of the comparators 34, 36, 38, 40 and 42. The other terminal of these comparators 34 through 42 have a threshold voltage applied thereto (the threshold voltage could be approximately 3.65 volts when referenced between +5 V and ground). If the amplified converted clock signals, input to the comparators, are higher than the threshold voltage level, a high output signal is generated therefrom. If the amplified converted clock signals are lower than the threshold voltage level, a low level output signal is generated therefrom. The output signals from these comparators are generated at different times due to the different lengths of the transmission lines within cable 18, that is, the different lengths along the channel paths.

Delay lines 70 through 76 have sixteen input taps, I0 through I15. Each tap of the delay line associated with a single data channel gives, for example, approximately 0.3 nsec delay time, so that the total adjustment range is approximately 4.8 nsec for each individual data channel. The output end of each of the comparators 34–40 is connected, respectively, to an end tap of one of the delay lines 70–76, for example, tap I0. Multiplexers 56 through 62 are connected to each of the delay lines 70 through 76. Each multiplexer 56 through 62 has four control input terminals, S0 through S3. Each controller 64 and 66 has eight output terminals V0 through V7. Four of the output terminals of controller 64 (V4–V7) are connected to the control input terminal (S0–S3) of multiplexer 56. The other four output terminals of controller 64 (V0–V3) are connected to the control input terminals S0–S3 of multiplexer 58. Similar connections are made between controller 66 and multiplexers 60 and 62. The signals present on the four output terminals V4–V7 of controller 64, for example, represent a 4-digit binary number, this 4-bit binary signal energizing terminals S0–S3 of multiplexer 56. Similarly, the signals present on terminals V0–V3 also represent a 4-digit binary number, this 4-bit binary signal energizing terminals S0–S3 of multiplexer 58. Four-bit binary signals also energize terminals S0–S3 of multiplexers 60 and 62.

Each multiplexer has an output terminal Z, which is connected to one of the input taps I0–I15. The controllers 64 and 66 (via the 4-bit binary signals energizing the input terminals S0 through S3 of the multiplexers 56 through 62) determine and control to which input terminal I0 through I15 the output terminal Z is connected. For example, controller 64 generates a 4-bit binary signal from terminals (V4–V7) representing a 4-digit binary number, the 4-bit binary signal energizing terminals (S0–S3) of multiplexer 56. The particular binary number determines to which input terminal (I0–I15) of multiplexer 56, the output terminal Z is connected.

Time delay compensation for data channel 1, corresponding to connector C1, will be explained in the paragraphs to follow. As mentioned hereinbefore, the outputs of each of the comparators 34, 36, 38, and 40 may arrive at their respective tapped delay lines 70 through 76 at different points in time, due to the variations in the cable length of the individual transmission lines within cable 18. Initially, in the calibration mode, each controller 64 and 66 is reset, and output terminal Z of each of the multiplexers 56 through 62 is connected to a center input tap of the multiplexer, for example, tap I7. As mentioned hereinbefore, a high output signal is generated from comparator 34 if the amplified converted clock signal, input thereto, is higher than the threshold voltage level. The high output signal, generated from comparator 34, is delayed a certain amount in delay line 70 corresponding to center tap I7. A delayed high output signal is generated from the multiplexer 56 at terminal Z, the signal being received by input terminal D1 of the latch circuit 67. In addition, the clock terminal of latch 67 receives a clock pulse as well. If the clock pulse is received at the clock terminal of latch 67 before the delayed high output signal from multiplexer 56 is received at terminal D1, the output Q1 of the latch 67 will be low. CPU 68 will detect this low output at terminal Q1 of latch circuit 67, and will generate an output signal to controller 64 in response thereto. Controller 64 will then, in response thereto, generate a 4-bit binary signal from terminals V4–V7, the 4-bit binary number determining to which input tap (I0–I15) terminal Z should be connected. The 4-bit binary signal directs multiplexer 56 to decrease the delay time of data channel 1, that is, to reconnect the output terminal Z of multiplexer 56 to tap I6, in lieu of I7. Connection of the output terminal Z of multiplexer 56 to tap I6 will subtract 0.3 nsec delay time from the total amount of delay which takes place when the output of comparator 34 passes through the delay line 70. In this way, the delayed high output signal from terminal Z of multiplexer 56 will be generated sooner in time relative to the time of generation of this output signal from terminal Z when Z was connected to tap I7. CPU 68 then instructs the clock generator 52 to generate another clock signal. The above described operation will repeat again, until output Q1 of latch circuit 67 becomes high, that is, when the delayed high output signal generated from terminal Z of multiplexer 56 is received at terminal D1 before the clock signal is received at the clock terminal of the latch circuit 67. When the CPU 68 detects this transistion, from low to high, corresponding to the output signal at terminal Q1 of latch 67, CPU 68 will instruct controller 64 to store therein the binary number represented by the 4-bit binary signal, which energized the corresponding input terminals, S0 through S3 of multiplexer 56, and which connected the terminal Z to one of the correct corresponding input taps, I0 through I7, and fixed the proper amount of delay in delay line 70. At this point in time, data channel 1 is deskewed against the clock channel. That is, the difference in propagation time elapsed between the time for propagation of the the clock signal through data channel 1 and the time for propagation of the clock signal through the clock channel has been substantially eliminated by virtue of the circuitry shown in blocks 30 and 50 of FIG. 3.

When the clock signal, through the clock channel, is received at the clock terminal of latch 67 subsequently to the receipt of the clock signal at terminal D1, the output Q1 of the latch circuit 67 is "high". CPU 68 detects this "high", and instructs the controller 64, in response thereto, to increase the delay time of the data channel 1, that is, the output terminal Z of multiplexer 56 is connected to tap I8 for adding 0.3 nsec delay time to the previous delay time in data channel 1. This output terminal Z is connected to the tap I8 in response to a 4-bit binary signal generated from the output terminals V4 through V7 of controller 64 and being applied to terminals S0–S3 of multiplexer 56. Depending upon the particular binary number represented by the 4-bit binary signal, the output terminal Z will be reconnected to one of the center taps I0 through I15 of the multiplexer 56, in this example, tap I8.

When the output terminal Z of the multiplexer 56 is connected to tap I8, the CPU instructs the clock generator 52 to regenerate the clock signal. The above described operation is repeated until the output Q1 from the input latch circuit 67 becomes "low". When the CPU 68 detects this transition, from high to low, the CPU 68 instructs the controller 64 to store therein the binary number represented by the 4-bit binary signal, which was generated from terminals V4 through V7, and which energized input terminals S0 through S3, of the multiplexer 56 and which fixed the proper amount of delay in delay line 70. At this point, the logic signal present in data channel 1 is deskewed against the clock signal in the clock channel, that is, the propagation time difference (the difference in time elapsed between the propagation of the clock signal through the data channel and through the clock channel) has been eliminated as a result of the appropriate amount of delay set in delay line 70.

The other data channels, 2 through 4 are also deskewed against the clock channel in the same manner as described above with respect to data channel 1. The time of arrival of the logic signals in each of the other data channels, 2–4, is compared with the time of arrival of the reference clock pulse received at the clock terminal of latch 67, and the delay is adjusted in delay lines 72, 74, and 76 in accordance with these comparisons and the storage of the appropriate 4-bit binary signals for proper energization of the multiplexers 56–62 being stored by the appropriate controllers 64 and 66 for use during the measurement mode. As a result, the times for propagation of the clock signals through the data channels are made equal to the time for propagation of the clock signal through the clock channel.

In the measurement mode, the outputs from the latch circuit 67 are then applied to the CPU 68, the outputs being stored in the acquisition memory residing therein as in a typical logic analyzer.

As a result of the present invention during the measurement mode in the utilization of the same circuit as shown in FIG. 3, deskewed logic signals will appear on the CRT screen of the logic analyzer, for all channels, regardless of the different lengths of the transmission lines in cable 18 and the resultant different propagation times of the logic signals transmitted therethrough.

The invention being thus described, it will be obvious that the same may be varied in many ways. Such variations are not to be regarded as a departure from the spirit and scope of the invention and all such modifications as would be obvious to one of ordinary skill in the art are intended to be included within the scope of the following claims.

We claim as our invention:

1. An input apparatus for compensating for unequal propagation times of a plurality of data transmission lines, said input apparatus comprising:
   a reference transmission line;
   means for generating a timing signal and for applying said timing signal to the input ends of said data transmission lines and to the input end of said reference transmission line;
   variable delay means connected at the output ends of said data transmission lines for receiving said timing signal at differing times as determined by the propagation characteristics of each data transmission line, and for developing a corresponding plurality of time delayed signals in response thereto, each of said time delayed signals being delayed with respect to its corresponding received timing signal by an appropriate time delay;
   reference means connected at the output end of said reference transmission line for receiving said timing signal and for generating a reference signal in response thereto; and control means responsive to said time delayed signals and to said reference signal for individually adjusting each of said appropriate time delays such that the time of generation of said time delayed signals substantially coincides with the time of generation of said reference signal.

2. A method of compensating for variations in signal propagation time existing among the channels of a multi-channel apparatus, comprising the steps of:

generating a timing signal, said timing signal being propagated along a plurality of data transmission lines and along a reference transmission line;

individually delaying said timing signal along each of said data transmission lines by an appropriate time delay thereby developing a plurality of delayed timing signals;

delaying said timing signal along said reference transmission line by a fixed time delay thereby developing a reference signal;

receiving said delayed timing signals and said reference signal;

comparing the time of receipt of each of said delayed timing signals with the time of receipt of said reference signal; and controlling said appropriate time delay associated with each of said timing signals until the time of receipt of each of said delayed timing signals substantially coincides with the time of receipt of said reference signal.

3. An input apparatus as recited in claim 1 wherein said variable delay means comprises a plurality of tapped delay lines and multiplexers, with each of said data transmission lines being connected to input terminals of one of said multiplexers through one of said tapped delay lines, and with output terminals of said multiplexers being connected to said control means, wherein the time of arrival of a corresponding timing signal at each of said input terminals of said one of said multiplexers is dependent upon the connection between said input terminals and said one of said tapped delay lines, and wherein said appropriate time delays are selected by connecting selected ones of said input terminals to corresponding output terminals of said multiplexers.

4. An input apparatus as recited in claim 3 wherein said reference means is a fixed delay line, and wherein said control means comprises:

latch means, coupled to said output terminals of said multiplexers and to said reference signal, for indicating the relative time delay between said time delayed signals and said reference signal;

a controller coupled to said multiplexers for selecting the connections between said input and output terminals of said multiplexers; and processing means responsive to said latch means for selecting said appropriate time delays by directing said controller to form appropriate connections between said input and output terminals of said multiplexers.

* * * * *